(12) United States Patent
Lai et al.

(10) Patent No.: US 11,625,075 B2
(45) Date of Patent: Apr. 11, 2023

(54) ELECTRONIC DEVICE

(71) Applicant: ASUSTeK COMPUTER INC., Taipei (TW)

(72) Inventors: Chin-Chung Lai, Taipei (TW);
Yung-Hsiang Chen, Taipei (TW);
Shih-Wei Yang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/501,333

(22) Filed: Oct. 14, 2021

(65) Prior Publication Data
US 2022/0121247 A1 Apr. 21, 2022

(30) Foreign Application Priority Data

Oct. 19, 2020 (TW) ................... 109136183

(51) Int. Cl.
*H05K 5/00* (2006.01)
*G06F 1/16* (2006.01)
*H05K 7/16* (2006.01)

(52) U.S. Cl.
CPC ......... *G06F 1/1681* (2013.01); *H05K 5/0017* (2013.01); *H05K 7/16* (2013.01)

(58) Field of Classification Search
None
See application file for complete search history.

(56) References Cited

U.S. PATENT DOCUMENTS

| | | | | |
|---|---|---|---|---|
| 5,719,799 A * | 2/1998 | Isashi | ...................... | G06F 1/169 345/169 |
| 9,677,308 B1 * | 6/2017 | Chen | ...................... | G06F 1/1681 |
| 10,015,897 B1 * | 7/2018 | Hong | .................. | H04M 1/0247 |
| 10,480,227 B1 * | 11/2019 | Chen | ...................... | E05D 3/122 |
| 10,901,468 B2 * | 1/2021 | Xia | ...................... | H04M 1/0218 |
| 2017/0275935 A1 * | 9/2017 | Shang | ...................... | E05D 3/12 |
| 2019/0166703 A1 * | 5/2019 | Kim | ...................... | H04M 1/022 |

FOREIGN PATENT DOCUMENTS

| | | |
|---|---|---|
| CN | 203324901 U | 12/2013 |
| CN | 104460834 A | 3/2015 |
| CN | 204493594 U | 7/2015 |
| CN | 103713692 B | 5/2017 |
| CN | 209821721 U | 12/2019 |

* cited by examiner

*Primary Examiner* — Anthony Q Edwards
*Assistant Examiner* — Rashen E Morrison
(74) *Attorney, Agent, or Firm* — McClure, Qualey & Rodack, LLP

(57) ABSTRACT

An electronic device includes a first body, a pivot assembly and a second body. The first body includes a first side and a second side, and the second side includes a groove. The pivot assembly includes a container, a first gear, a second gear and a third gear. The container includes an accommodating space and a side wall. The first gear is disposed in the accommodating space and connected to the groove. The second gear is disposed in the accommodating space, pivotally disposed at the side wall and engaged with the first gear. The third gear is disposed in the accommodating space, pivotally disposed at the side wall and engaged with the second gear. The second body is pivotally disposed at the container and connected to the third gear.

9 Claims, 4 Drawing Sheets

ELECTRONIC DEVICE

CROSS-REFERENCE TO RELATED APPLICATION

This application claims the priority benefit of Taiwan application serial No. 109136183, filed on Oct. 19, 2020. The entirety of the above-mentioned patent application is hereby incorporated by reference herein and made a part of the specification.

BACKGROUND OF THE INVENTION

Field of the Invention

The disclosure relates to an electronic device, and in particular, to an electronic device including a pivot assembly.

Description of the Related Art

A general notebook computer is mainly composed of a host, a display, and a pivot assembly pivotally connected between the host and the display. When the display is opened relative to the host, the display often falls over due to a deviation of a center of gravity, resulting in inconvenience in use.

BRIEF SUMMARY OF THE INVENTION

The disclosure provides an electronic device, including a first body, a pivot assembly, and a second body. The first body includes a first side and a second side relative to the first side, and the second side includes a groove. The pivot assembly is partially disposed in the groove and includes a container, a first gear, a second gear, and a third gear.

The container includes an accommodating space and a side wall. The first gear is disposed in the accommodating space, passes through the side wall and is connected to the groove. The second gear is disposed in the accommodating space, pivotally disposed at the side wall and engaged with the first gear. The third gear is disposed in the accommodating space, pivotally disposed at the side wall and engaged with the second gear. The second body is pivotally disposed at the container and connected to the third gear. When the second body is opened relative to the first body, the second body rotates and drives the second gear to rotate through the third gear, and the container rotates in the groove by using the first gear as a fulcrum, so that the third gear moves a distance from the second side to the first side.

According to the pivot assembly disclosed in the disclosure, when the second body of the electronic device is opened relative to the first body, the container rotates, and the entire center of gravity of the electronic device moves forward, thus avoids the display of the electronic device to fall over, thereby improving the convenience in use.

DETAILED DESCRIPTION OF THE EMBODIMENTS

Figure 1:
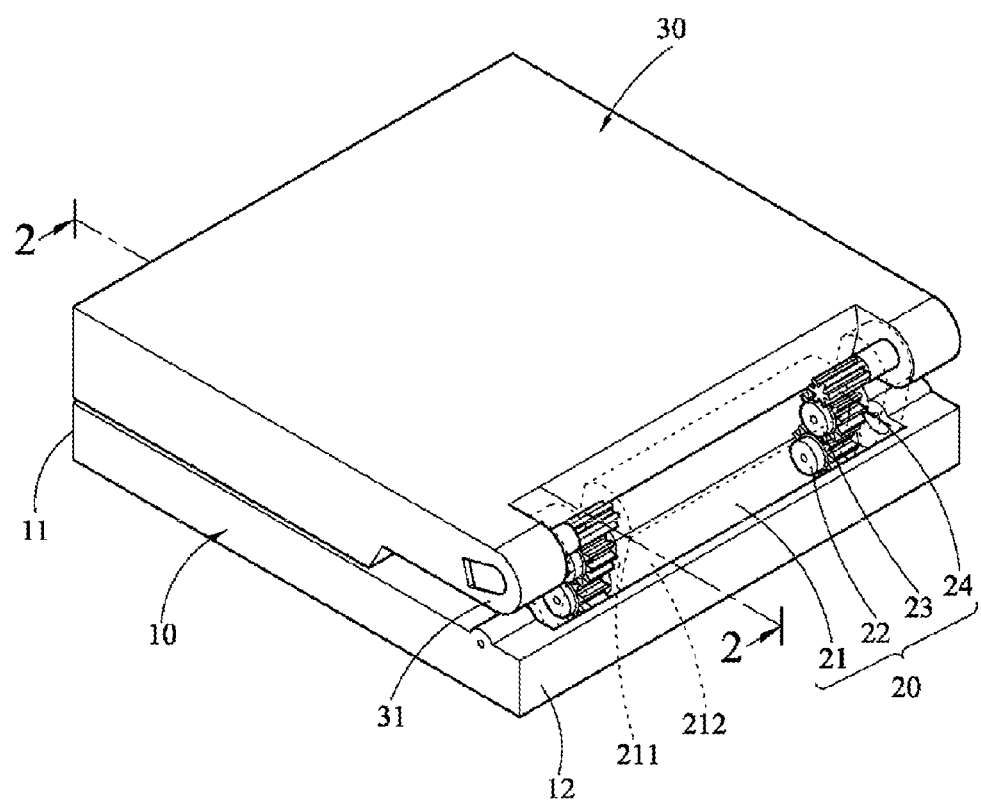
FIG. 1 is a schematic three-dimensional outside view of an embodiment of an electronic device in a closed state according to the disclosure.

Referring to FIG. 1 to FIG. 4, an electronic device, such as a notebook computer is provided. The electronic device includes a first body 10, a pivot assembly 20 and a second body 30. The first body 10 includes a first side 11 and a second side 12 relative to the first side 11, and the second side 12 includes a groove 13. The pivot assembly 20 is partially disposed in the groove 13 and includes a container 21, a first gear 22, a second gear 23, and a third gear 24. The container 21 includes an accommodating space S and a side wall 211.

The first gear 22 is disposed in the accommodating space S, passes through the side wall 211 and is connected to the groove 13. The second gear 23 is disposed in the accommodating space S, pivotally disposed at the side wall 211 and engaged with the first gear 22. The third gear 24 is disposed in the accommodating space S, pivotally disposed at the side wall 211 and engaged with the second gear 23.

The second body 30 is pivotally disposed at the container 21 and connected to the third gear 24. When the second body 30 is opened relative to the first body 10, the second body 30 rotates and drives the second gear 23 to rotate through the third gear 24. The container 21 rotates in the groove 13 by using the first gear 22 as a fulcrum, so that the third gear 24 moves a distance from the second side 12 to the first side 11.

Figure 3:
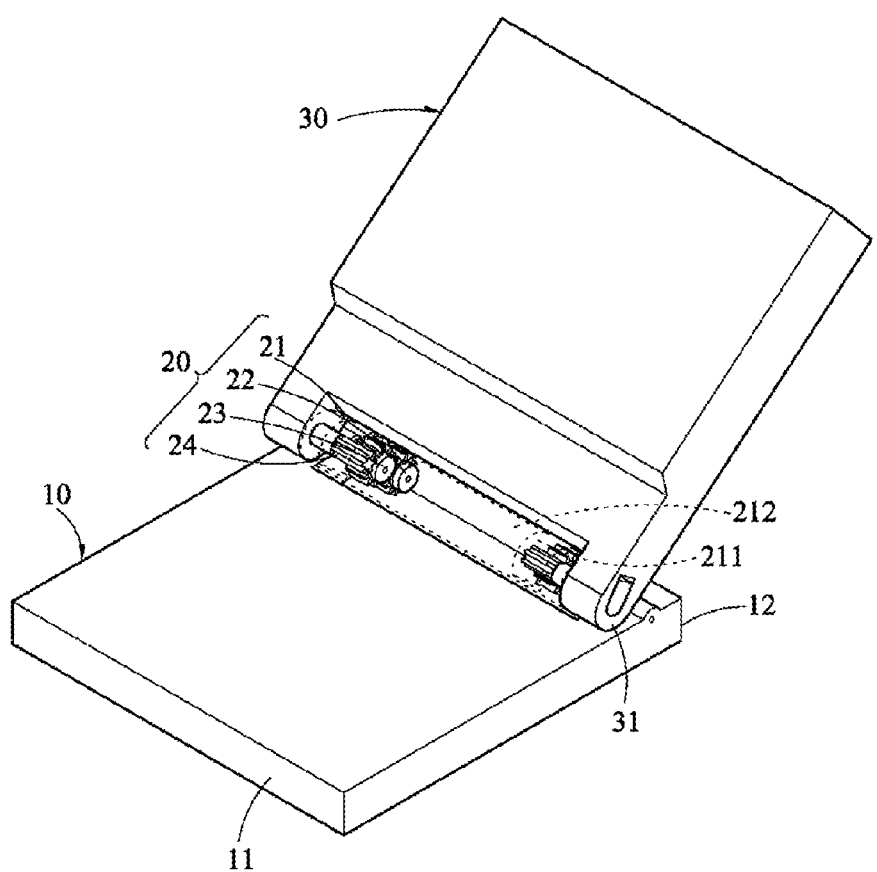
FIG. 3 is a schematic three-dimensional outside view of an embodiment of an electronic device in an open state according to the disclosure.

Referring to FIG. 1 and FIG. 3, in an embodiment, the first body 10 is a host of a notebook computer that equips with input modules, such as a keyboard, a touch panel, and the like. The second body 30 is a display of the notebook computer. Herein, the second body 30 is pivotally connected to the first body 10 at a position close to the second side 12.

Referring to FIG. 1 and FIG. 3, in an embodiment, to improve the stability between the first body 10 and the second body 30, the pivot assembly 20 includes a container 21, two first gears 22, two second gears 23, and two third gears 24.

In an embodiment, a modular assembly is formed by the first gears 22, the second gears 23, the third gears 24, and the container 21, and is assembled between the first body 10 and the second body 30.

Referring to FIG. 1 to FIG. 4, in an embodiment, the container 21 includes a plurality of side walls 211 and a circumferential surface 212 connecting the side walls 211. In an embodiment, a space surrounded by the two side walls 211 of the container 21 and the circumferential surface 212 is used for accommodating electronic parts or wires.

Figure 2:
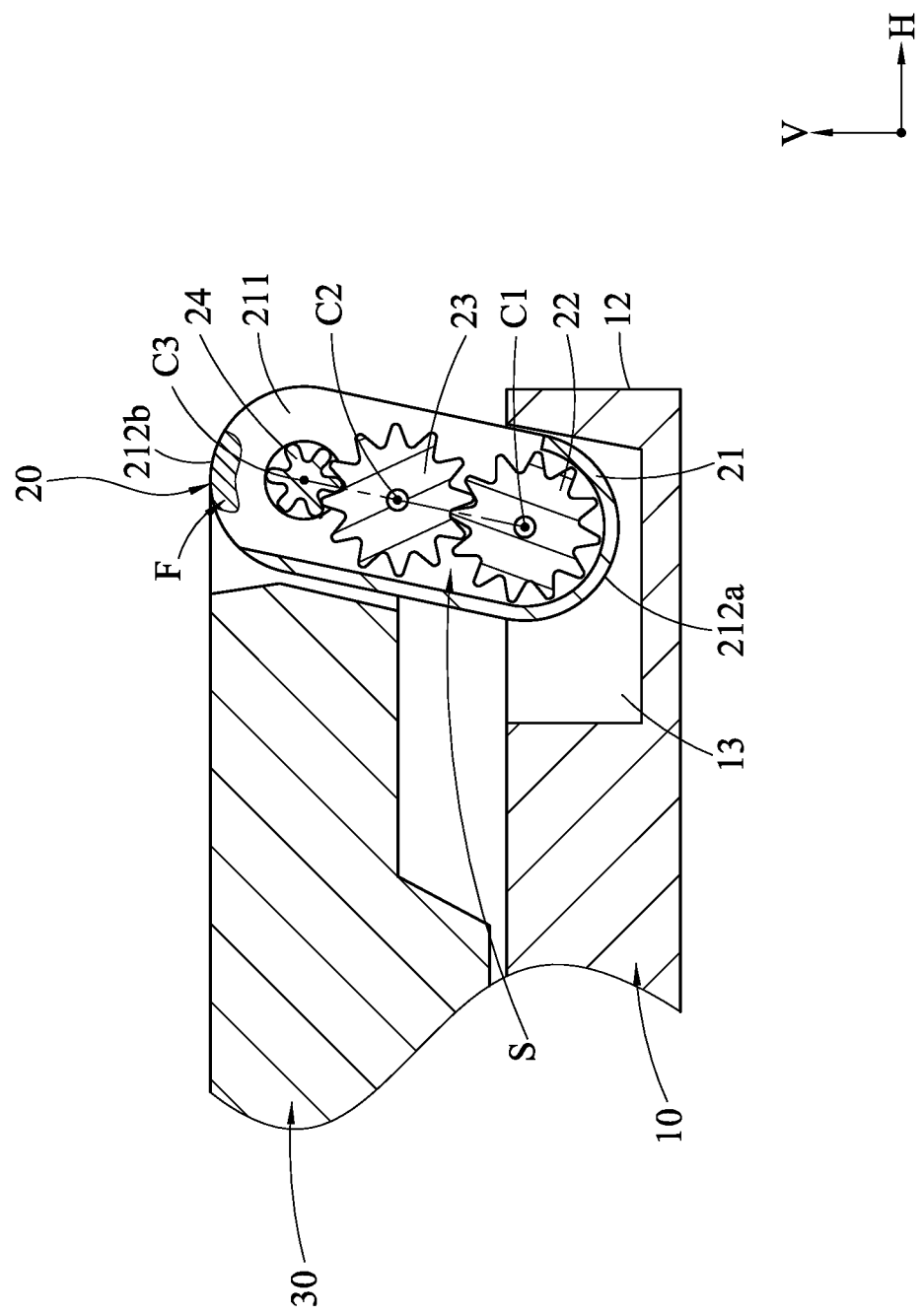
FIG. 2 is a partial structural cross-sectional view taken along a cutting line 2-2 in FIG. 1.

Referring to FIG. 1 and FIG. 2, in an embodiment, the circumferential surface 212 of the container 21 extends along a contour of the side wall 211. For ease of description, the circumferential surface 212 of the container 21 is defined as a first surface 212a, and a second surface 212b locates opposite to each other. Referring to FIG. 1 and FIG. 2, in an embodiment, the first gear 22 is disposed between the two opposite side walls 211 of the container 21, and the container 21 is pivotally connected to the first body 10. In addition, the first gear 22 is further fixedly connected to the first body 10. Herein, the first gear 22 includes a first circle center C1, the first circle center C1 and a circle center of the first surface 212a being the same.

Therefore, in a case that the first body 10 and the first gear 22 keep stationary, the container 21 rotates in the groove 13 by using the first gear 22 as a fulcrum.

Referring to FIG. 1 and FIG. 2, in an embodiment, the second gear 23 is pivotally disposed between the two opposite side walls 211 of the container 21, and the second gear 23 is engaged with the first gear 22. Herein, when the second gear 23 rotates, the second gear 23 rotates around an outer periphery of the first gear 22 due to the first gear 22 is fixed to the first body 10, and the container 21 also moves with the second gear 23. Herein, the second gear 23 includes a second circle center C2.

Referring to FIG. 1 and FIG. 2, in an embodiment, the third gear 24 is pivotally disposed between the two opposite side walls 211 of the container 21. The second body 30 is connected to the third gear 24. Therefore, the second body 30 drives the third gear 24 to rotate, the third gear 24 then drives the second gear 23 to rotate, and the rotation of the second gear 23 then drives the container 21 to move. Herein, the third gear 24 includes a third circle center C3, the third circle center C3 and a circle center of the second surface 212b being the same.

Referring to FIG. 2, in an embodiment, a line connecting a vertex of the first surface 212a, a vertex of the second surface 212b and circle centers of the first gear 22, the second gear 23, and the third gear 24 is a straight line.

The action change of the pivot assembly 20 when the second body 30 changes from a closed state to an open state is described below. In an embodiment, FIG. 2 shows that the second body 30 is in a closed state relative to the first body 10. From a perspective of FIG. 2 and referring to FIG. 1, an extending direction of a surface of the first body 10 abutting against the second body 30 is a horizontal direction H. In the horizontal direction H, the first circle center C1 is more closer to the second side 12 than the third circle center C3.

Figure 4:
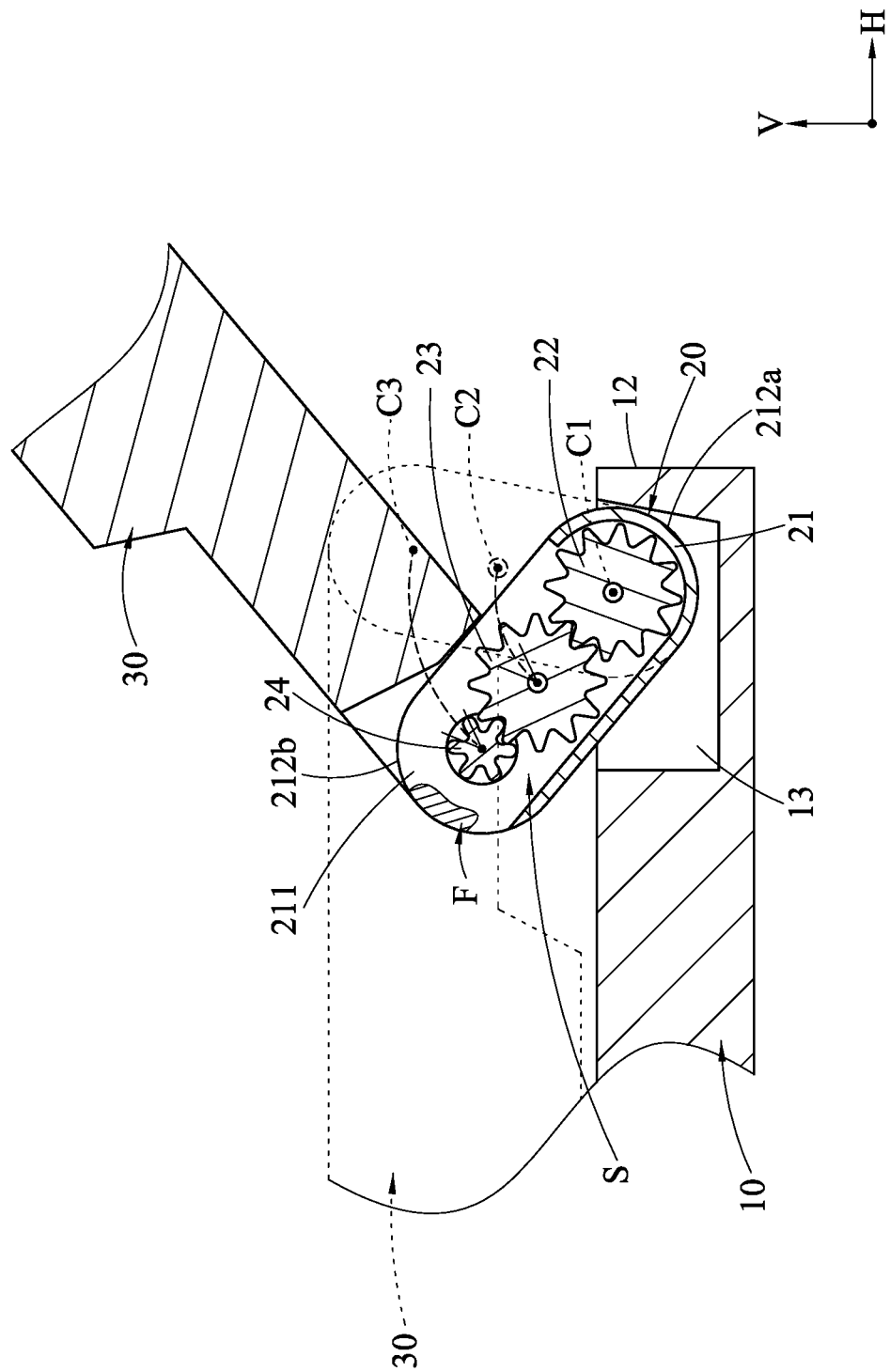
FIG. 4 is a partial structural cross-sectional view of an embodiment of an electronic device in an open state according to the disclosure.

Still referring to FIG. 2 and referring to FIG. 3 and FIG. 4, when the second body 30 is opened relative to the first body 10, the second body 30 rotates clockwise and drives the third gear 24 to rotate clockwise. When the third gear 24 rotates clockwise, the third gear 24 drives the second gear 23 to rotate counterclockwise. The second gear 23 rotates counterclockwise along the outer periphery of the first gear 22, and also drives the entire container 21 to rotate counterclockwise.

Still referring to FIG. 3 and FIG. 4, after the container 21 rotates counterclockwise by using the first gear 22 as the fulcrum, positions of the second gear 23 and the third gear 24 in the horizontal direction H move close to the first side 11 of the first body 10 with the container 21.

Referring to FIG. 3 and FIG. 4, therefore, the second body 30 also correspondingly moves close to the first side 11 of the first body 10. After the second body 30 enters the open state, in a vertical direction V perpendicular to the horizontal direction H, a part of the second body 30 overlaps the first body 10, that is, in a case that the second body 30 is in the open state, a part of the second body 30 is supported by the first body 10, so that a situation that the second body falls over due to unbalance of the center of gravity is reduced, and usage stability is enhanced.

Referring to FIG. 2 and FIG. 4, in an embodiment, the first surface 212a of the container 21 of the pivot assembly 20 is located in the groove 13, and the first surface 212a is more closer to the first gear 22 than the second surface 212b.

In an embodiment, a functional unit (F) is disposed in the container 21 of the pivot assembly 20, and the functional unit (F) is exposed through the second surface 212b. Herein, the functional unit (F) is a speaker, a camera lens or an I/O connection port. Therefore, after the second body 30 is opened relative to the first body 10, the container 21 rotates with the second body 30, so that the second surface 212b faces a direction where a user is located, thereby improving the convenience in use.

In an embodiment, the second body 30 is sleeved on both sides of the container 21 through two opposite assembly portions 31, and thus connected to the third gear 24 of the pivot assembly 20. In this way, when the second body 30 is in the closed state relative to the first body 10, the first surface 212a of the container 21 is exposed between the two assembly portions 31. After the second body 30 is opened relative to the first body 10, the rotation of the container 21 also enables the second surface 212b to face the user. Regardless of which state the electronic device is in, the functional unit (F) disposed in the container 21 is provided to the user for use, and the usage convenience is high.

Although the disclosure is described with reference to some embodiments, the embodiments are not intended to limit the disclosure. A person of ordinary skill in the art may make variations and modifications without departing from the spirit and scope of the disclosure. Therefore, the protection scope of the disclosure should be subject to the appended claims of this specification.

What is claimed is:

1. An electronic device, comprising:
a first body, comprising a first side and a second side relative to the first side, wherein the second side comprises a groove;
a pivot assembly, partially disposed in the groove, comprising:
a container, comprising an accommodating space and a side wall;
a first gear, disposed in the accommodating space, passing through the side wall and fixedly connected to the groove;
a second gear, disposed in the accommodating space, pivotally disposed at the side wall and engaged with the first gear; and
a third gear, disposed in the accommodating space, pivotally disposed at the side wall and engaged with the second gear; and
a second body, pivotally disposed at the container and connected to the third gear; wherein, when the second body is opened relative to the first body, the second body rotates and drives the third gear to rotate, the third gear drives the second gear to rotate, the second gear rotates around an outer periphery of the first gear, and the container rotates in the groove by using the first gear as a fulcrum, so that the third gear moves a distance from the second side to the first side.

2. The electronic device according to claim 1, wherein the container comprises a first surface and a second surface relative to the first surface.

3. The electronic device according to claim 2, wherein the first surface and the second surface are respectively arc surfaces.

4. The electronic device according to claim 3, wherein a line connecting a vertex of the first surface, a vertex of the second surface and circle centers of the first gear, the second gear, and the third gear is a straight line.

5. The electronic device according to claim 2, wherein the first surface is accommodated in the groove.

6. The electronic device according to claim 5, wherein the first surface is more closer to the first gear than the second surface.

7. The electronic device according to claim 6, further comprising a functional unit disposed at the second surface, wherein the functional unit is an input/output port.

8. The electronic device according to claim 6, further comprising a functional unit disposed at the second surface, wherein the functional unit is a camera lens.

9. The electronic device according to claim 6, further comprising a functional unit disposed at the second surface, wherein the functional unit is a speaker.

* * * * *